United States Patent
Sidhu et al.

(10) Patent No.: US 9,950,393 B2
(45) Date of Patent: Apr. 24, 2018

(54) HYBRID LOW METAL LOADING FLUX

(75) Inventors: Rajen S. Sidhu, Chandler, AZ (US); Martha A. Dudek, Chandler, AZ (US); James C. Matayabas, Jr., Chandler, AZ (US); Michelle S. Phen, Chandler, AZ (US); Wei Tan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 137 days.

(21) Appl. No.: 13/976,001

(22) PCT Filed: Dec. 23, 2011

(86) PCT No.: PCT/US2011/067277
§ 371 (c)(1),
(2), (4) Date: Jun. 25, 2013

(87) PCT Pub. No.: WO2013/095670
PCT Pub. Date: Jun. 27, 2013

(65) Prior Publication Data
US 2013/0341379 A1 Dec. 26, 2013

(51) Int. Cl.
*B23K 35/02* (2006.01)
*B23K 35/362* (2006.01)
(Continued)

(52) U.S. Cl.
CPC .......... *B23K 35/025* (2013.01); *B23K 35/362* (2013.01); *H01L 23/488* (2013.01); *H01L 24/03* (2013.01); *H01L 24/05* (2013.01); *H01L 24/11* (2013.01); *H05K 3/3489* (2013.01); *H01L 21/4853* (2013.01); *H01L 23/49816* (2013.01); *H01L 24/13* (2013.01); *H01L 2224/0381* (2013.01); *H01L 2224/03828* (2013.01); *H01L 2224/03829* (2013.01);
(Continued)

(58) Field of Classification Search
USPC ...................................................... 148/22–24
See application file for complete search history.

(56) References Cited

U.S. PATENT DOCUMENTS 3,963,162 A * 6/1976 Taguchi .................. B23K 1/18
                                                228/134
6,340,113 B1   1/2002 Avery et al.
(Continued)

FOREIGN PATENT DOCUMENTS

JP     2011-238669        11/2011
JP     2011238669 A   *  11/2011

OTHER PUBLICATIONS

Abstract and Machine Translation for JP Publication No. 2011-238669, dated Nov. 24, 2011, 9 pp.
(Continued)

*Primary Examiner* — Devang R Patel
(74) *Attorney, Agent, or Firm* — Konrad Raynes Davda & Victor LLP; Alan S. Raynes

(57) ABSTRACT

Flux formulations and solder attachment during the fabrication of electronic device assemblies are described. One flux formation includes a flux component and a metal particle component, the metal particle component being present in an amount of from 5 to 35 volume percent of the flux formulation. In one feature of certain embodiments, the metal particle component includes solder particles. Other embodiments are described and claimed.

25 Claims, 3 Drawing Sheets

(51) Int. Cl.
*H01L 23/00* (2006.01)
*H05K 3/34* (2006.01)
*H01L 23/488* (2006.01)
*H01L 23/498* (2006.01)
*H01L 21/48* (2006.01)

(52) U.S. Cl.
CPC ............ *H01L 2224/03849* (2013.01); *H01L 2224/0401* (2013.01); *H01L 2224/058* (2013.01); *H01L 2224/05794* (2013.01); *H01L 2224/05809* (2013.01); *H01L 2224/05811* (2013.01); *H01L 2224/05813* (2013.01); *H01L 2224/05817* (2013.01); *H01L 2224/05839* (2013.01); *H01L 2224/05844* (2013.01); *H01L 2224/119* (2013.01); *H01L 2224/11334* (2013.01); *H01L 2224/11848* (2013.01); *H01L 2224/11849* (2013.01); *H01L 2224/131* (2013.01); *H01L 2924/3511* (2013.01); *H01L 2924/3841* (2013.01); *H05K 2203/041* (2013.01); *H05K 2203/046* (2013.01)

(56) References Cited

U.S. PATENT DOCUMENTS

| | | | |
|---|---|---|---|
| 7,224,067 B2 * | 5/2007 | Suh | 257/772 |
| 7,331,500 B2 | 2/2008 | Martin et al. | |
| 7,578,966 B2 | 8/2009 | Suh | |
| 7,651,020 B2 | 1/2010 | Shekhawat et al. | |
| 7,700,476 B2 | 4/2010 | Suh et al. | |
| 7,955,411 B2 * | 6/2011 | Yasuda | B22F 1/0014 428/403 |
| 8,701,281 B2 | 4/2014 | Sidhu et al. | |
| 2004/0250919 A1 * | 12/2004 | Saito et al. | 148/25 |
| 2005/0067468 A1 | 3/2005 | Lu et al. | |
| 2005/0139644 A1 * | 6/2005 | Brese | B23K 35/025 228/248.1 |
| 2005/0217757 A1 * | 10/2005 | Miyano | 148/24 |
| 2006/0196579 A1 | 9/2006 | Skipor et al. | |
| 2007/0284412 A1 | 12/2007 | Prakash et al. | |
| 2008/0085410 A1 * | 4/2008 | Simone | B22F 1/0018 428/355 CP |
| 2008/0156852 A1 | 7/2008 | Prakash | |
| 2008/0156895 A1 | 7/2008 | Mellody et al. | |
| 2009/0107584 A1 * | 4/2009 | Sengupta et al. | 148/24 |
| 2009/0301606 A1 * | 12/2009 | Ueshima | B23K 35/0244 148/24 |
| 2009/0308496 A1 * | 12/2009 | Kawamata et al. | 148/24 |
| 2010/0035072 A1 * | 2/2010 | Watanabe et al. | 428/457 |
| 2011/0147066 A1 | 6/2011 | Sidhu et al. | |
| 2013/0199673 A1 * | 8/2013 | Yanson | B01J 23/462 148/24 |

OTHER PUBLICATIONS

International Search Report and Written Opinion for International Application No. PCT/US2011/067277, dated Sep. 20, 2012, 10 pp. [77.225PCT (ISR & WO)].

Shen, J., et al., "Effect of Metal/Ceramic Nanoparticle-Doped Fluxes on the Wettability Between Sn—Ag—Cu Solder and a Cu Layer", Journal of Alloys and Compounds 477, 2009, 6 pp.

International Preliminary Report on Patentability (IPRP) for International Application No. PCT/US2011/067277, dated Jul. 3, 2014, 7 pp. [77.225 (IPRP)].

Senju Metal Industry Co., Ltd. Solder Paste web page http://www.senju-m.co.jp/en/product/ecosolder/paste/index.html dated Dec. 20, 2011, 3 pp.

\* cited by examiner

HYBRID LOW METAL LOADING FLUX

BACKGROUND

Solder balls are often placed onto substrate surfaces to form electrical connections between, for example, a plurality of conductive pads on a first substrate and a plurality of conductive pads on a second substrate. The substrates being electrically coupled together may include, for example, a semiconductor chip (a chip is also known as a die), a package substrate such as a ball grid array (BGA) package substrate, and a support substrate such as a printed circuit board (PCB) substrate. The solder ball is heated to melt (reflow) and forms a bond with the pad. Another reflow heat treatment is typically carried out to couple the substrate to another substrate through the solder. A flux composition is often used to assist in the bonding of the solder ball to the pad on the substrate. The flux may generally act to isolate the pad from the atmosphere, and clean the pad to enhance the ability of the solder to wet the pad during reflow. The flux may also provide an adhesive force which acts to hold the ball to the pad on the substrate.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art may not be included to maintain the clarity of the drawings.

Figure 1:
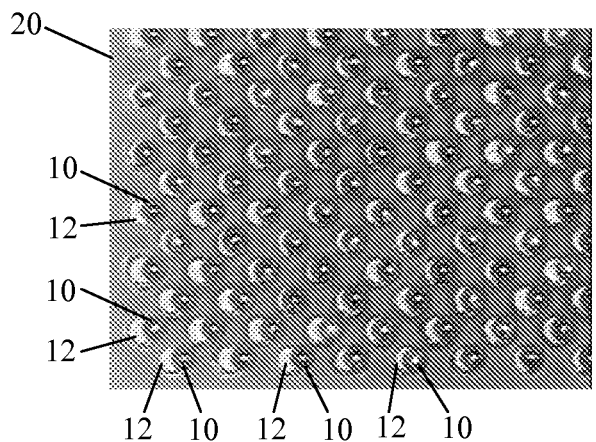
FIG. 1 illustrates a micrograph of BGA pads having solder balls positioned thereon prior to a reflow operation.

Positioning solder balls on a BGA (ball grid array) substrate prior to reflow becomes more difficult as substrates become smaller and the pitch between pads becomes smaller. In addition, as substrates become thinner, they may display a level of warpage that makes it difficult to hold the solder balls in place on the surface in the proper location. Solder paste methods have been used, where a solder paste (typically including a mixture of about 90 weight percent solder and 10 weight percent liquid flux), is printed onto bonding pads on a substrate. However, when warpage is present, solder pastes may have an insufficient level of tackiness to hold a solder ball in place prior to reflow. Flux only methods have been used, where a liquid flux composition is sprayed onto bonding pads on a substrate. A conventional liquid flux, however, may not provide sufficient ball pull back to bring an offset solder ball back onto the pad. FIG. 1 is a photomicrograph of solder balls 10 on a portion of BGA substrate surface 20 prior to reflow. The substrate surface 20 includes circular pads 12 onto which the solder balls 10 are positioned. As seen in FIG. 1, in many locations the solder balls 10 do not cover the entire pad 12 and instead are offset from the pad 12, with a portion of solder ball 10 on the pad 12 and a portion of the solder ball 10 off of the pad 12. The amount of solder ball 10 offset in FIG. 1 is up to approximately 40-50 percent. At a pitch of, for example, 0.5 mm, the use of a conventional liquid flux does not provide sufficient pull back to enable effective self alignment of the 40-50% offset solder balls during reflow, as illustrated in FIG. 2.

Figure 2:
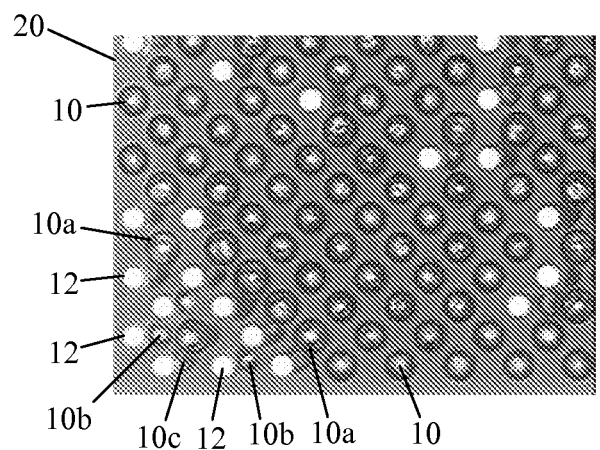
FIG. 2 illustrates a micrograph of the BGA pads and solder balls of FIG. 1, after a reflow operation.

FIG. 2 illustrates the same BGA substrate surface 20 as FIG. 1, after reflow. The surface 20 shows a variety of defects including empty pads, misplaced solder, and solder bridging defects. Some of the pads 12 are completely covered by solder balls 10 that have properly bonded to the pads 12. However, a substantial number of pads 12 are completely uncovered by solder balls 10. Instead, in certain locations, the solder balls 10 have combined and coalesced into larger solder balls 10a. In other locations, solder balls 10b have positioned themselves between pads 12. In still other locations the solder has broken down into smaller regions of solder 10c.

Certain embodiments relate to flux formulations that have suitable properties of tackiness to hold solder balls during the ball placement operation and also display sufficient pull back properties to enable solder ball self alignment on the pad prior to reflow. Such embodiments act to inhibit solder bridging defects formed due to misaligned solder balls.

Embodiments may include a flux formulation including a flux component and a metal particle component. A variety of flux components may be used. In certain embodiments, the flux component includes an acid component and a solvent component. In certain embodiments, additional flux ingredients including, but not limited to amines, rosins, and other additives may be present. Certain embodiments may include no clean and water soluble flux compositions including metal particles.

In one aspect of certain embodiments, the acid component may include a plurality of acids. Certain embodiments may include mono, di, and tri carboxylic acids comprising between about 2 and 20 carbons. Examples of acids that may be suitable include, but are not limited to, glycolic acid, oxalic acid, succinic acid, malonic acid, and the like, and their combinations. Certain embodiments include organic acids, although inorganic acids may also be used. A wide variety of suitable solvents may be used, including, but not limited to, alcohols, glycol ethers, hydrocarbons, water, and combinations thereof. In another aspect of certain embodiments, the flux may include an amine component. Suitable amines may include, but are not limited to, butyl amine, diethylbutyl amine, dimethylhexyl amine, and the like, and their combinations. The activators (which may include the acid and amine components) may include halogenated and non-halogenated activators. The activators act to remove oxide from the metal pad to help prepare the pad surface for forming a bond to solder.

In another aspect of certain embodiments, the flux may also include rosin, which may be naturally occurring or synthetically modified. In another aspect of certain embodiments, the flux may also include additional additive ingredients, including, but not limited to, surfactants, thickening agents, colorant, buffers, and the like, and their combinations.

The metal particles present in embodiments may include solder particles. The particles may be in the form of a powder. A variety of solder materials may be used. In certain embodiments, the solder particles are selected to have a melting point that is less than 250° C. In another aspect of certain embodiments, the solder particles are selected to have a melting point that is lower than that of the solder ball to be placed onto the pad for reflow. This permits the solder particles in the flux to melt, wet the pad, and pull back a misaligned solder ball prior to the solder ball reflowing.

Embodiments may utilize a variety of solder particle compositions, including, but not limited to, Sn (tin) based solders (for example, alloys of Sn—Ag—Cu, Sn—Cu, Sn—Ag, etc.). Specific examples of solder compositions that may be suitable in certain embodiments include, but are not limited to, SAC305 (96.5 weight percent tin, 3 percent silver, and 0.5 weight percent copper), 48Sn-52In (48 weight percent tin and 52 weight percent indium), 42Sn-58Bi (48 weight percent tin and 52 weight percent indium), In (indium), 86.5Sn-5.5Zn-4.5In-3.5Bi (86.5 weight percent tin-5.5 weight percent zinc, 4.5 weight percent indium, and 3.5 weight percent bismuth), and 91Sn-9Zn (91 weight percent tin and 9 weight percent zinc).

In certain embodiments, the solder particles may have a relatively small grain size, of up to 15 μm. In certain embodiments, the metal particles may include nanoparticles. The metal particles may be present in certain embodiments in an amount of 5 to 35 weight percent. It is believed that if the weight percentage of the particles is above 35 weight percent, the flux formulation may not have sufficient tackiness. It is also believed that if the weight percentage of the particles is below 5 weight percent, the flux formulation may not have sufficient pull back properties to pull a misaligned solder ball back onto a pad. Other ranges are also possible. For example, certain embodiments are believed to have favorable tackiness and pull back properties with a range of 10 to 30 weight percent. One embodiment utilizes about 20 weight percent of the metal particles.

In certain embodiments, the metal particles include both solder particles and metal particles of other materials including surface active elements. The surface active elements may be particles of pure metals such as rare earths and noble metals. The surface active particles may in certain embodiments be nanoparticles having a particle size in the range of 1-100 nm. Particular examples that may be suitable include, but are not limited to, Ag, Au, and Ge nanoparticles. In certain embodiments, the composition includes up to 5 weight percent of the surface active particles. It has been found that the presence of the surface active particles in certain embodiments can further enhance the ability of the flux formulation to align a misplaced solder ball on a pad prior to reflow.

In certain embodiments, flux formulations may be formed to have a tackiness greater than about 100 gf. Such a level of tackiness, together with the presence of 5-35 weight percent metal particles as described above, should enable successful attachment of solder balls to small pitch packages, for example, those with less than 0.5 mm pitch. The combinations of certain ingredients may be varied as known in the art, for example, to provide a water soluble or to provide a no clean flux with a desired amount of tackiness.

Embodiments may utilize flux formulations such as described above during joining operations coupling a variety of components together. Examples include, but are not limited to, a package substrate to a board, a semiconductor chip to a package substrate, and a capacitor to a substrate.

Figure 3:
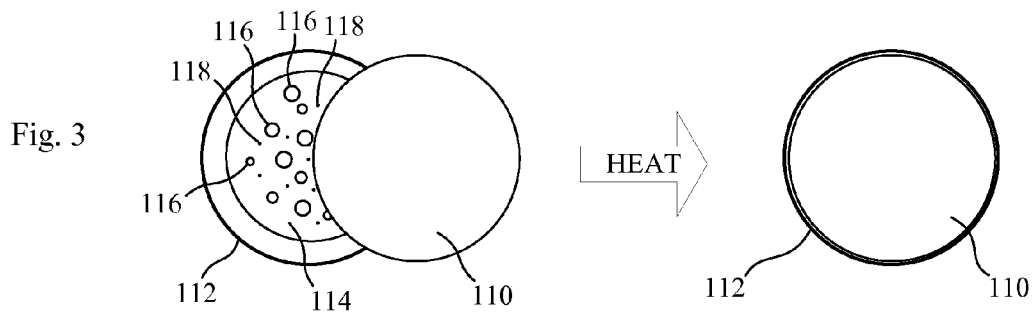
FIG. 3 illustrates an offset solder ball being pulled back onto a pad, in accordance with certain embodiments.

Certain embodiments may provide benefits relating to the ability to pull back misaligned solder balls onto a bonding pad, as described above. It is believed that this occurs due to the presence of the metal particles in the formulation. FIG. 3 illustrates a solder ball 110 initially positioned on a bonding pad 112 in a manner such that the solder ball 110 is misaligned and only partially on the bonding pad 112. A flux formulation 114 in accordance with certain embodiments is positioned on the bonding pad 112. The flux formulation 114 includes a plurality of metal particles 116, 118 therein. In this embodiment, the metal particles 116 include solder particles having a melting point less than that of the solder ball 110. By having a lower melting point, upon exposure to heat at a temperature less than the reflow temperature of the solder ball 110, the solder particles 116 will melt and coalesce together. As the particles 116 positioned between the solder ball 110 and the pad 112 coalesce together and with the particles 116 positioned elsewhere on the bonding pad, the misaligned solder ball 110 is pulled back onto the bonding pad 112, as illustrated in FIG. 3. Then upon reflow, the solder ball 110 is properly positioned on the bonding pad 112 and a strong joint between the solder and pad is formed. With the solder ball 110 properly positioned on the bonding pad 112, the occurrence of solder from adjacent solder balls merging together, or solder being positioned in the locations between the bonding pads, or bonding pads missing solder, are minimized or eliminated.

FIG. 3 illustrates metal particles 118 that are surface active nanoparticle elements such as, for example, Ag, Au, and Ge, and are optional in certain embodiments. It is believed that they act to further improve the driving force for coalescing the solder particles 116, which improves the ability of the flux formulation to pull back misaligned solder balls. The term solder balls as used herein may refer to solder bodies that are spherical or non-spherical in shape.

Figure 4:
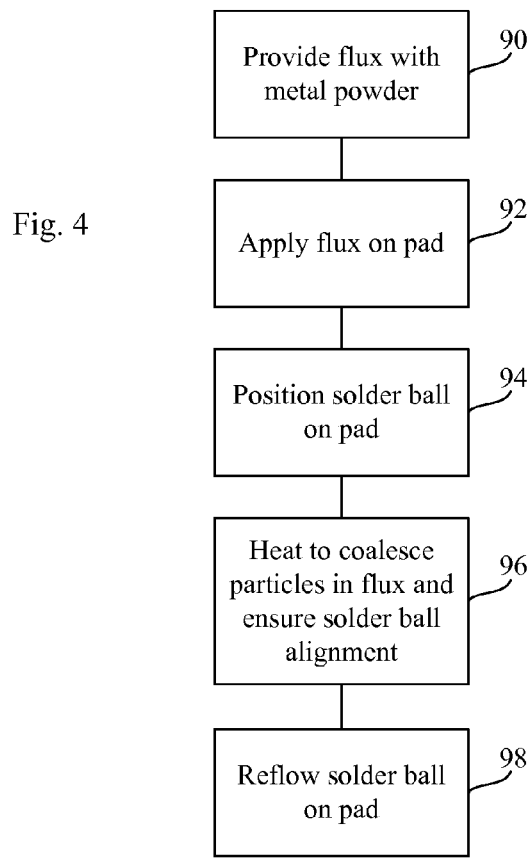
FIG. 4 illustrates a flowchart of operations in accordance with certain embodiments.

FIG. 4 illustrates a flowchart of operations in accordance with certain embodiments. Box 90 is providing a flux formulation including metal particles therein. The metal particles include solder particles. Box 92 is applying the flux formulation to a bonding pad. The bonding pad may be any structure to which a contact may be made. Box 94 is positioning a solder ball on the bonding pad. Depending on factors such as, for example, the positioning technique and the substrate flatness, the solder ball may be only partially on the bonding pad. Box 96 is heating the flux to a temperature sufficient to coalesce the solder particles but lower than the reflow temperature. As the solder particles coalesce, the solder ball will be pulled into position on the bonding pad if it was misaligned. Box 98 is heating to a reflow temperature of the solder ball to couple the solder ball to the bonding pad.

In addition to benefits described above, certain embodiments may also provide other benefits in relation to conventional solder paste and liquid flux methods for attachment. By having a lower metal load than solder paste methods, the presence of voids is substantially decreased. For example, certain embodiments include 5-35 weight percent metal particles, whereas conventional solder pastes include about 90 weight percent metal particles. Fewer voids will mean fewer defects in the solder joint. In addition, because certain embodiments include a higher metal load and lower amount of liquid than conventional liquid fluxes, there will be less liquid residue after the reflow operation. As a result, embodiments may have a variety of advantages over conventional solder ball attachment methods. Depending on factors such as, for example, the size of the solder balls, the pad size, the pitch, and the warpage of the substrate (if any), the flux formulations may be tailored to provide enhanced properties such as tackiness, pull back, etc. For instance, in certain embodiments, a higher metal load may provide an enhanced pull back effect, and a lower metal load may provide an enhance tackiness.

Figure 5:
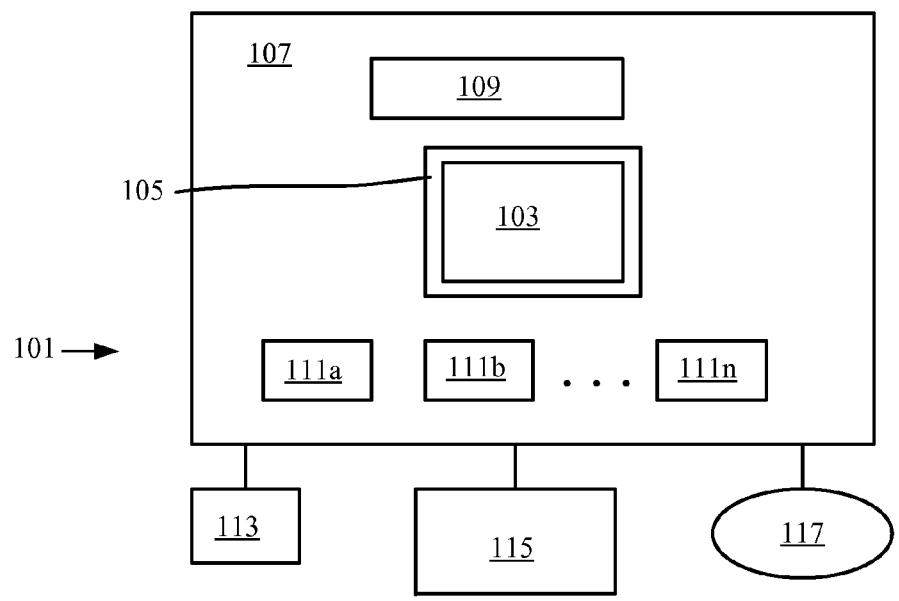
FIG. 5 illustrates an electronic system arrangement in which embodiments may find application.

Assemblies including structures joined together as described above may find application in a variety of electronic components. FIG. 5 schematically illustrates one example of an electronic system environment in which described embodiments may be embodied. Other embodiments need not include all of the features specified in FIG. 5, and may include alternative features not specified in FIG. 5.

The system 101 of FIG. 5 may include at least one central processing unit (CPU) 103. The CPU 103, also referred to as a microprocessor, may be a die which is attached to an integrated circuit package substrate 105, which is then coupled to a printed circuit board 107, which in this embodiment, may be a motherboard. The package substrate 105 that is coupled to the board 107 is an example of an electronic device assembly that may be formed in accordance with embodiments such as described above, with a flux such as described above used in the ball attachment operation for attaching solder balls to the package substrate 105. A variety of other system components, including, but not limited to, the CPU, memory and other components discussed below, may also include the use of flux formed in accordance with the embodiments described above to couple solder balls to a substrate.

The system 101 may further include memory 109 and one or more controllers 111a, 111b . . . 111n, which are also disposed on the motherboard 107. The motherboard 107 may be a single layer or multi-layered board which has a plurality of conductive lines that provide communication between the circuits in the package 105 and other components mounted to the board 107. Alternatively, one or more of the CPU 103, memory 109 and controllers 111a, 111b . . . 111n may be disposed on other cards such as daughter cards or expansion cards. The CPU 103, memory 109 and controllers 111a, 111b . . . 111n may each be seated in individual sockets or may be connected directly to a printed circuit board. A display 115 may also be included.

Any suitable operating system and various applications execute on the CPU 103 and reside in the memory 109. The content residing in memory 109 may be cached in accordance with known caching techniques. Programs and data in memory 109 may be swapped into storage 113 as part of memory management operations. The system 101 may comprise any suitable computing device, including, but not limited to, a mainframe, server, personal computer, workstation, laptop, tablet, handheld computer, handheld gaming device, handheld entertainment device (for example, MP3 (moving picture experts group layer—3 audio) player), PDA (personal digital assistant), reader, telephony device (wireless or wired), network appliance, virtualization device, storage controller, network controller, router, etc.

The controllers 111a, 111b . . . 111n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 113 in accordance with a storage protocol layer. The storage protocol of the layer may be any of a number of known storage protocols. Data being written to or read from the storage 113 may be cached in accordance with known caching techniques. A network controller can include one or more protocol layers to send and receive network packets to and from remote devices over a network 117. The network 117 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A flux formulation comprising:
   a flux component; and
   a metal particle component including solder particles and pure metal particles, wherein the metal particle component is present in an amount of 5 to 20 weight percent of the flux formulation;
   wherein the pure metal particles are present in an amount of up to 5 weight percent of the flux formulation;
   wherein the solder particles and the pure metal particles comprise discrete particles positioned in the flux component;
   wherein a plurality of the pure metal particles have a particle size in the range of 1-100 nm; and
   wherein the solder particles have a particle size of up to 15 µm.

2. The flux formulation of claim 1, wherein the flux component comprises an acid component, an amine component, a rosin component, and a solvent component.

3. The flux formulation of claim 1, wherein the solder particles comprise at least one metal and the solder particles have a melting point of less than 250° C.

4. The flux formulation of claim 1, wherein the solder particles include Sn and In.

5. The flux formulation of claim 1, wherein the pure metal particles are selected from the group consisting of noble metals and rare earth metals.

6. The flux formulation of claim 1, wherein the pure metal particles are present in an amount of 5 weight percent of the flux formulation.

7. A flux formulation comprising:
   a flux component; and
   a metal particle component including first particles and second particles having a different composition than the first particles, the first particles comprising a solder, wherein the metal particle component is present in an amount of 5 to 20 weight percent of the flux formulation;

wherein the second particles are present in an amount of up to 5 weight percent of the flux formulation;

wherein the first particles and the second particles comprise particles positioned in the flux component;

wherein the first particles have a particle size of up to 15 μm;

wherein the second particles have a particle size in the range of 1-100 nm; and wherein the second particles have a particle size that is smaller than that of the first particles.

8. The flux formulation of claim 7, wherein the first particles comprise Sn and In.

9. The flux formulation of claim 7, wherein the first particles comprise Sn and Zn.

10. The flux formulation of claim 7, wherein the second particles comprise a rare earth metal.

11. The flux formulation of claim 7, wherein the second particles comprise a noble metal.

12. The flux formulation of claim 7, wherein the second particles comprise Ge.

13. The flux formulation of claim 7, wherein the first particles comprise a plurality of elements selected from the group consisting of Sn, Ag, and Cu.

14. The flux formulation of claim 7, wherein the first particles comprise Sn and Bi.

15. An assembly comprising the flux formulation of claim 7, further comprising a bonding pad on which the flux formulation is positioned, and a solder ball on the flux formulation, wherein the solder ball has a melting point that is greater than that of the first particles in the metal particle component of the flux formulation.

16. The flux formulation of claim 1, wherein the metal particle component is present in an amount of 5 weight percent of the flux formulation.

17. The flux formulation of claim 1, wherein the metal particle component is present in an amount of 20 weight percent of the flux formulation.

18. The flux formulation of claim 1, wherein the metal particle component is present in an amount of 10 weight percent of the flux formulation.

19. The flux formulation of claim 7, wherein the metal particle component is present in an amount selected from the group consisting of 5 weight percent of the flux formulation and 10 weight percent of the flux formulation.

20. The flux formulation of claim 7, wherein the metal particle component is present in an amount of 20 weight percent of the flux formulation.

21. The flux formulation of claim 7, wherein the second particles are present in an amount of 5 weight percent of the flux formulation.

22. A flux formulation comprising:

a flux component comprising a liquid;

a metal particle component including first particles and second particles having a different composition than the first particles, the first particles comprising solder particles, wherein the metal particle component is present in an amount of about 5 to 20 weight percent of the flux formulation;

wherein the second particles are present in an amount of up to 5 weight percent of the flux formulation;

wherein the first particles and the second particles comprise particles positioned in the flux component;

wherein the solder particles have a particle size of up to 15 μm;

wherein a plurality of the second particles have a particle size in the range of 1-100 nm; and wherein the flux formulation has a tackiness that is greater than about 100 gf.

23. The flux formulation of claim 22, wherein the metal particle component is present in an amount selected from the group consisting of 5 weight percent of the flux formulation and 10 weight percent of the flux formulation.

24. The flux formulation of claim 22, wherein the metal particle component is present in an amount of 20 weight percent of the flux formulation.

25. The flux formulation of claim 22, wherein the second particles are present in an amount of 5 weight percent of the flux formulation.

* * * * *